(12) United States Patent
Maru

(10) Patent No.: US 6,405,341 B1
(45) Date of Patent: Jun. 11, 2002

(54) MULTI-DIMENSIONAL PSEUDO NOISE GENERATING CIRCUIT FOR SOFT-DECISION DECODING

(75) Inventor: Tsuguo Maru, Tokyo (JP)

(73) Assignee: NEC Corporation (JP)

(*) Notice: Subject to any disclaimer, the term of this patent is extended or adjusted under 35 U.S.C. 154(b) by 0 days.

(21) Appl. No.: 09/413,601

(22) Filed: Oct. 6, 1999

(30) Foreign Application Priority Data

Oct. 9, 1998 (JP) .......................................... 10-287488

(51) Int. Cl.$^7$ ........................ H03M 13/00; H03M 13/03

(52) U.S. Cl. ...................... 714/780; 714/792; 714/795; 375/262; 375/265; 375/341; 375/348

(58) Field of Search ................................ 714/780, 792, 714/795; 375/225, 262, 265, 341, 233, 340, 347, 348; 370/342, 465; 455/13.1, 69, 13.4, 522

(56) References Cited

U.S. PATENT DOCUMENTS

| | | | |
|---|---|---|---|
| 5,396,516 A | * 3/1995 | Padovani et al. | ............ 375/225 |
| 5,574,751 A | * 11/1996 | Trelewicz | .................... 375/265 |
| 6,085,067 A | * 7/2000 | Gallagher et al. | ......... 455/13.1 |
| 6,298,242 B1 | * 10/2001 | Schiff | ......................... 455/522 |

* cited by examiner

Primary Examiner—Emmanuel L. Moise
(74) Attorney, Agent, or Firm—Dickstein, Shapiro, Morin & Oshinsky, LLP.

(57) ABSTRACT

A multi-dimensional pseudo noise generating circuit for soft-decision decoding, comprising: PN generating means for generating a signal of binary length code; a memory for storing a threshold level based on predetermined probability density function; address generating means for generating an address of the memory; and comparison means for comparing a data read from the memory with the binary length code generated by the PN generating means in a preset bit length. The address of the address generating means is successively updated based on a result from the comparison means and an address at the end of comparison is output as pseudo noise information.

9 Claims, 7 Drawing Sheets

MULTI-DIMENSIONAL PSEUDO NOISE GENERATING CIRCUIT FOR SOFT-DECISION DECODING

BACKGROUND OF THE INVENTION

The present invention relates to a test method of a communication apparatus, and especially to a pseudo noise generating circuit for conducting a test of an error correcting function in combination of soft decision and an error correcting function after rake combining under Rayleigh fading environment.

Conventionally, soft decision error correction is used in mobile communication apparatuses, and as represented by a soft decision Viterbi decoder, it becomes to be an essential function because of its high coding gain.

Also, in recent years, adoption of a turbo code and so forth, which has a higher coding gain and gradually gets near a Shannon limit is being studied, and its importance is increasing.

However, a properly prepared method was not suitable for the test method.

For example, since a method which has been conventionally conducted is conducted by inserting a Rayleigh fading simulator on a radio circuit, a test cannot be conducted before passing through an RF circuit. In addition, since a measuring apparatus such as a phasing simulator is necessary, a method capable of conducting the test by means of a simple arrangement has been desired.

Usually, an arrangement of a mobile communication terminal can be roughly divided into a radio section (abbreviated to an RF section) and a baseband section. The baseband section and the RF section are often tested, respectively, independent of each other, and a final test is conducted by finally comparing individually tested parts with each other. Accordingly, retrograde workload can be reduced by extracting problems in the individual tests as much as possible and restricting the extraction of the problems to a minimum in the comparison test, and good efficiency can be obtained as a whole.

Also, in case of testing the soft decision error correcting function, since measurement of subtle error rate characteristic always receives interference due to other apparatus in an experimental room, it subject to be incorrect one which is not reproduced. In addition, the test in a subtle region requires a long time and causes us much anxiety.

SUMMARY OF THE INVENTION

It is an objective of the present invention to provide technology capable of detecting a problem at an early stage as much as possible, which was found in a final process.

Another objective of the present invention is to provide a circuit for accurately testing subtle error rate characteristic of a soft decision error correcting circuit without receiving interference from other apparatuses in an experimental room and so forth.

A further objective of the present invention is to test error rate characteristic of a soft decision error correcting circuit by means of a simple arrangement without need of a measurement apparatus such as a Rayleigh fading simulator.

A further objective of the present invention is to provide an efficient test circuit for a mobile communication terminal, in which even though an RF circuit does not exist, a soft decision error correcting circuit can be tested with a single baseband, and retrograde workload is less.

A multi-dimensional pseudo noise generating circuit for soft-decision decoding of the present invention for accomplishing the above-described objective has PN generating means for generating a signal of binary length code, a memory for storing a threshold level based on accumulative probability distribution function obtained by integrating predetermined probability density function is stored, address generating means for generating an address of the above-described memory, and comparison means for comparing a data read from the above-described memory with the binary length code generated by the PN generating means in a preset bit length, and is characterized in that the address of the above-described address generating means is successively updated based on a result from the above-described comparison means, and an address at the end of comparison is output as pseudo noise information.

Also, the above-described address generating means can be constructed so that an address value in which an MSB is one and other bits are zero is set as an initial value, and in case that the above-described binary length code is larger than a comparison result of the above-described comparison means, one is hold as a value of the above-described MSB, and in case that the above-described binary length code is smaller than a comparison result of the above-described comparison means, a value of the above-described MSB is set as zero, and subsequently, a value of the next digit bit of the above-described MSB is set as one, and in case that the above-described binary length code is larger than a comparison result of the above-described comparison means, one is hold as a value of the above-described next digit bit, and in case that the above-described binary length code is smaller than a comparison result of the above-described comparison means, processing for making a value of the above-described next digit bit zero is continued until an LSB, and a final address value is output as pseudo noise information.

A multi-dimensional pseudo noise generating circuit for soft-decision decoding of the present invention for accomplishing the above-described objective is characterized by having:

a first pseudo noise generating circuit having first PN generating means for generating a signal of binary length code, a first memory in which a threshold level based on accumulative probability distribution function obtained by integrating predetermined probability density function is stored, first address generating means for generating an address of the above-described first memory, and first comparison means for comparing a data read from the above-described first memory with the binary length code generated by the PN generating means in a preset bit length, wherein the address of the above-described first address generating means is successively updated based on a result from the above-described first comparison means, and an address at the end of comparison is output; and a second pseudo noise generating circuit having second PN generating means for generating a signal of binary length code, a second memory in which a threshold level based on accumulative probability distribution function obtained by integrating predetermined probability density function is stored, second address generating means for generating an address of the above-described second memory, and second comparison means for comparing a data read from the above-described second memory with the binary length code generated by the second PN generating means in a preset bit length, wherein the address of the above-described second address generating means is successively updated based on a result from the above-described second comparison means and an output from the above-described first pseudo noise generating circuit, and an address at the end of comparison is output as pseudo noise information.

In addition, the above-described first and second address generating means can be constructed so that an address value in which an MSB is one and other bits are zero is set as an initial value, and in case that the above-described binary length code is larger than a comparison result of the above-described comparison means, one is hold as a Value of the above-described MSB, and in case that the above-described binary length code is smaller than a comparison result of the above-described comparison means, a value of the above-described MSB is set as zero, and subsequently, a value of the next digit bit of the above-described MSB is set as one, and in case that the above-described binary length code is larger than a comparison result of the above-described comparison means, one is hold as a value of the above-described next digit bit, and in case that the above-described binary length code is smaller than a comparison result of the above-described comparison means, processing for making a value of the above-described next digit bit zero is continued until a lower bit, and a final address value is output as pseudo noise information.

Also, the above-described second pseudo noise generating circuit has a plurality of memories of which threshold levels stored therein are different from each other, and a selector for selecting a predetermined memory out of the above-described plurality of memories based on an output from the above-described first pseudo noise generating circuit, and the above-described second comparison means can be constructed so as to compare a threshold level output from the above-described selector with the binary length code generated by the above-described second PN generating means in a preset bit length.

Moreover, the multi-dimensional pseudo noise generating circuit can be constructed so as to have a plurality of the above-described first pseudo noise generating circuits, and so that an address of the second address generating means of the above-described second pseudo noise generating circuit is successively updated based on a result from the above-described second comparison means and outputs from the above-described plurality of first pseudo noise generating circuits, and an address at the end of comparison is output as pseudo noise information.

A multi-dimensional pseudo noise generating circuit for soft-decision decoding of the present invention for accomplishing the above-described objective is characterized by having:

a first pseudo noise generating circuit having first PN generating means for generating a signal of binary length code, a first memory in which a threshold level based on accumulative probability distribution function obtained by integrating predetermined probability density function is stored, first address generating means for generating an address of the above-described first memory, and first comparison means for comparing a data read from the above-described first memory with the binary length code generated by the PN generating means in a preset bit length, wherein the address of the above-described first address generating means is successively updated based on a result from the above-described first comparison means, and an address at the end of comparison is output;

a second pseudo noise generating circuit having second PN generating means for generating a signal of binary length code, a second memory in which a threshold level based on accumulative probability distribution function obtained by integrating predetermined probability density function is stored, second address generating means for generating an address of the above-described second memory, and second comparison means for comparing a data read from the above-described second memory with the binary length code generated by the second PN generating means in a preset bit length, wherein the address of the above-described second address generating means is successively updated based on a result from the above-described second comparison means and an output from the above-described first pseudo noise generating circuit, and an address at the end of comparison is output; and multiplication means for multiplying an output from the above-described first pseudo noise generating circuit by an output from the above-described second pseudo noise generating circuit, and outputting a result of this multiplication as pseudo noise information.

In addition, the above-described first and second address generating means can be constructed so that an address value in which an MSB is one and other bits are zero is set as an initial value, and in case that the above-described binary length code is larger than a comparison result of the above-described comparison means, one is hold as a value of the above-described MSB, and in case that the above-described binary length code is smaller than a comparison result of the above-described comparison means, a value of the above-described MSB is set as zero, and subsequently, a value of the next digit bit of the above-described MSB is set as one, and in case that the above-described binary length code is larger than a comparison result of the above-described comparison means, one is hold as a value of the above-described next digit bit, and in case that the above-described binary length code is smaller than a comparison result of the above-described comparison means, processing for making a value of the above-described next digit bit zero is continued until an LSB, and a final address value is output as pseudo noise information.

Also, the above-described second pseudo noise generating circuit has a plurality of memories of which threshold levels stored therein are different from each other, and a selector for selecting a predetermined memory out of the above-described plurality of memories based on an output from the above-described first pseudo noise generating circuit, and the above-described second comparison means can be constructed so as to compare a threshold level output from the above-described selector with the binary length code generated by the above-described second PN generating means in a preset bit length.

BRIEF DESCRIPTION OF THE INVENTION

This and other objects, features, and advantages of the present invention will become more apparent upon a reading of the following detailed description and drawings, in which.

DESCRIPTION OF THE EMBODIMENTS

Embodiments of the present invention will be explained in detail by referring to drawings.

First, a first embodiment will be explained.

Figure 1:
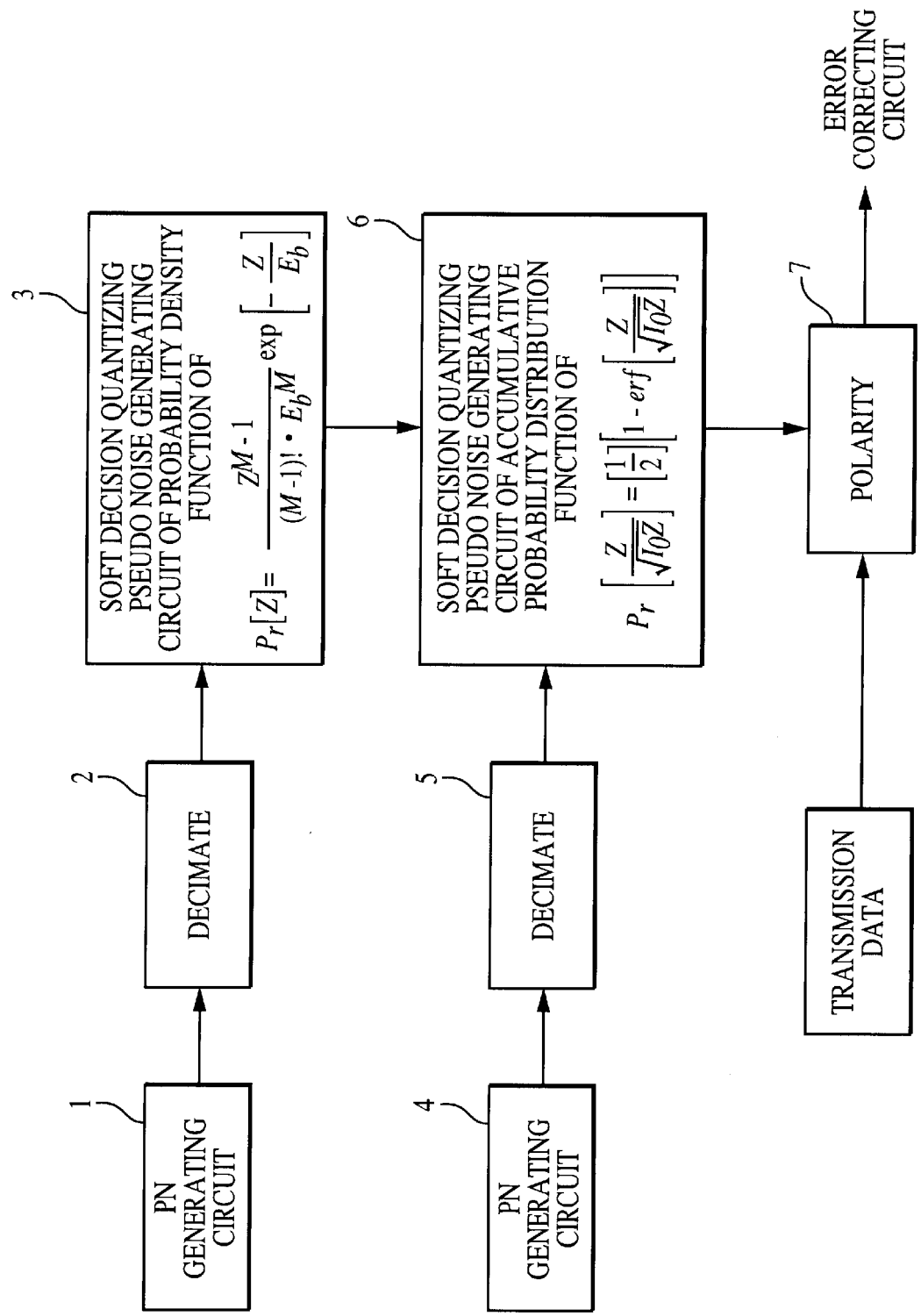
FIG. 1 is a block diagram of the soft decision pseudo noise generating circuit in the first embodiment.

FIG. 1 is a block diagram of a soft decision pseudo noise generating circuit in the first embodiment.

A soft decision pseudo noise generating circuit in the first embodiment is a circuit for testing a soft decision error correcting circuit during rake combining in a CDMA (Code Division Multiple Access) system under Rayleigh fading environment.

This soft decision pseudo noise generating circuit has a PN generating circuit 1 for signal distribution, which generates PN length code, a decimator 2 for decimating the PN length code generated by the PN generating circuit 1 for signal distribution, and a first soft decision quantizing pseudo noise generating circuit 3 for generating soft decision information from a signal decimated by this decimator 2 with predetermined probability density function.

Further, the soft decision pseudo noise generating circuit has a PN generating circuit 4 for generating a Gaussian noise independent of the PN generating circuit 1, a decimator 5 for decimating the PN length code generated by the PN generating circuit 4 for generating the Gaussian noise, and a second soft decision quantizing pseudo noise generating circuit 6 for generating a soft decision quantizing noise from a signal decimated by this decimator 5 with predetermined accumulative probability distribution function.

An output signal from the first soft decision quantizing pseudo noise generating circuit 3 is input to the second soft decision quantizing pseudo noise generating circuit 6, and the second soft decision quantizing pseudo noise generating circuit 6 determines soft decision quantizing information which is finally used, based on the first soft decision quantizing pseudo noise generating circuit 3 and a signal generated by decimating the PN length code from the PN generating circuit 4 for generating the Gaussian noise.

The first soft decision quantizing pseudo noise generating circuit 3 is for determining probability density function of a signal component, and the probability density function during rake combining in the CDMA system is determined in accordance with an equation (1).

$$p_r[Z] = \frac{Z^{M-1}}{(M-1)! \cdot E_b^M} \exp\left[-\frac{Z}{E_b}\right] \quad (1)$$

Where, Z is energy per bit after rake combining, Eb is energy for a bit per one finger, and M is the number of fingers which conduct the rake combining.

According to a literature "Andrew J. Viterbi, 'CDMA Principles of Spread Spectrum Communication'" p47, it can be assumed that, in the CDMA system, Rayleigh fading does not affect a noise component. Also in this embodiment, an example is shown in which the Rayleigh fading does not affect an interference wave component (noise component).

In addition, although not being shown in the drawings in this embodiment, processing is conducted, in which usually interleaving is applied by means of symbols before conducting soft decision error correction, and correlation between the symbols is set as non-correlation. Accordingly, also in the test circuit of this embodiment, the symbols are handled so as to have non-correlation with each other.

Successively, operation will be explained.

First, the PN length code generated by the PN generating circuit 1 for signal distribution is by means of M length code in this embodiment, and the M length code having a fully long period can be regarded as soft decision quantizing information having uniform probability distribution function if it is considered in light of a bit length predetermined for comparison. This soft decision quantizing information enhances statistical independency between the symbols by the decimator 2, and is input to the first soft decision quantizing pseudo noise generating circuit 3 for signal distribution. The first soft decision quantizing pseudo noise generating circuit 3 has an arrangement shown in FIG. 2, and the contents shown in FIG. 3 and FIG. 4 are stored in a ROM 21 in FIG. 2.

Figure 3:
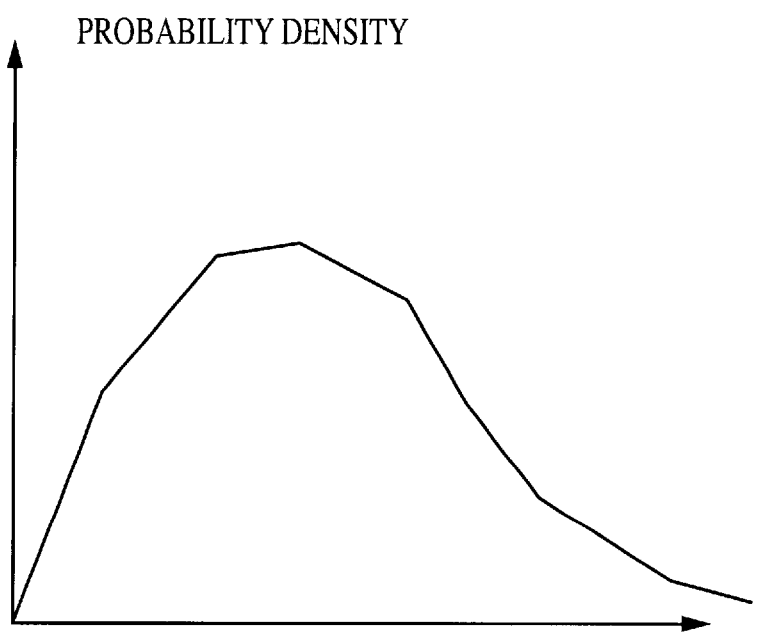
FIG. 3 is a view for explaining the contents of the ROM 2.

The probability density function of FIG. 3 is the above-mentioned equation (1), and a threshold level is set by means of accumulative probability distribution function obtained by integrating the probability density function.

Figure 4:
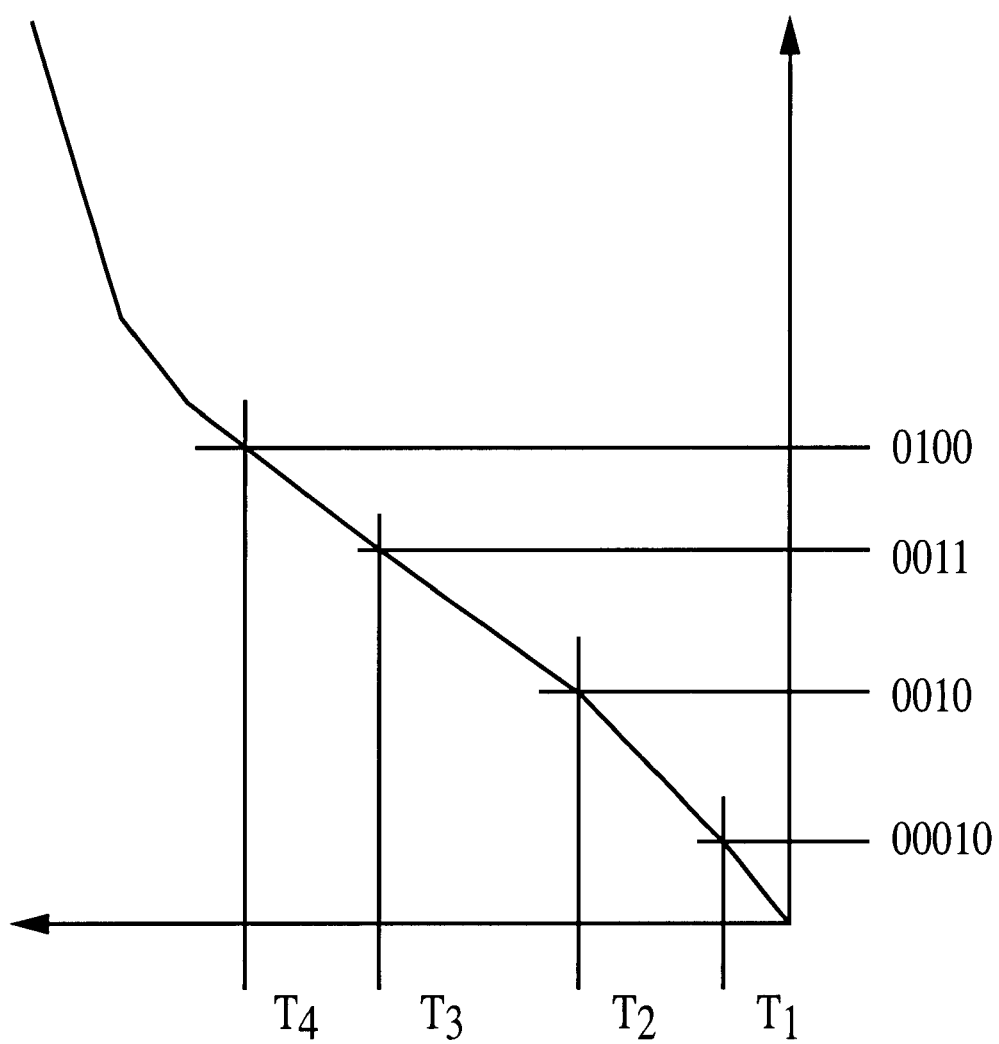
FIG. 4 is a view for explaining the contents of the ROM 2.

FIG. 4 shows an example of the threshold level set in this manner.

Operation of FIG. 2 will be explained while referring to FIG. 3 and FIG. 4, and an output from the PN generating circuit 1 is input to one input of a comparison circuit 22, and the ROM 21 in which the above-described threshold level is set is input to the other input. An address generating circuit 23 initially sets '1' in a most significant bit (MSB), and waits for an output result of the comparison circuit 22. The ROM 21 outputs the threshold level corresponding to an address to the comparison circuit 22. The comparison circuit 22 compares an output value of the PN generating circuit 1 (a signal decimated by the decimator 2) with a level provided from the ROM, and holds the bit in case that the output value of the PN generating circuit 4 is larger than the level. To the contrary, if being smaller, the bit is dropped.

Next, the address generating circuit 23 sets the second bit, and conducts the same processing. This processing is continued until a least significant bit, and an address value which finally remains becomes to be an output of the soft decision quantizing pseudo noise generating circuit 3. In other words, one random number is selected out of uniform distribution, and arbitrary probability density function can be generated by means of an accumulative probability distribution function designated by the ROM 21.

Figure 2:
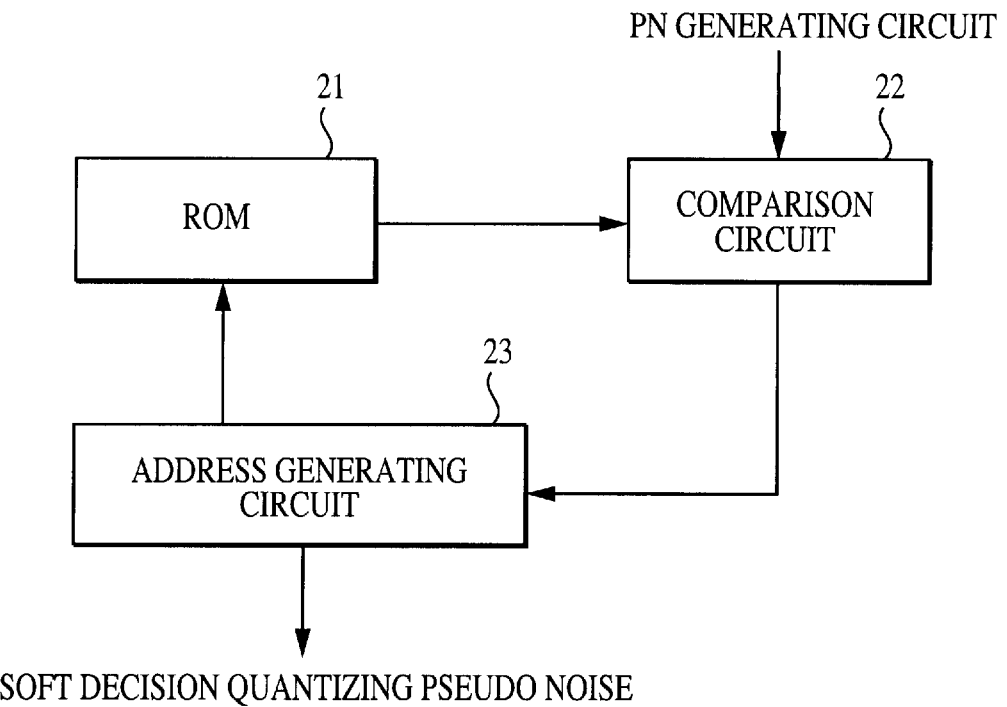
FIG. 2 is a view showing an arrangement of the first soft decision quantizing pseudo noise generating circuit 3.
Figure 5:
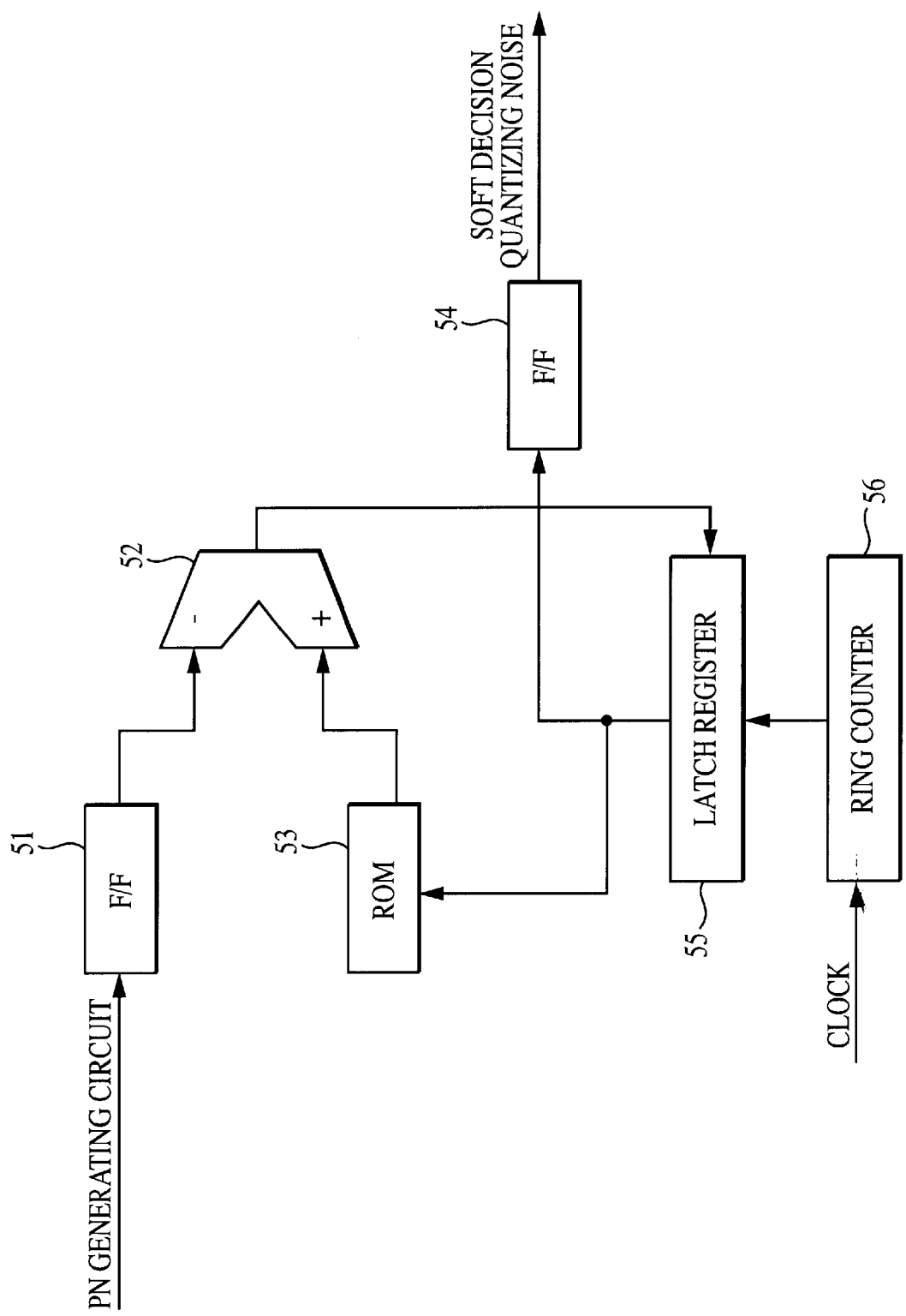
FIG. 5 is a view showing a particular embodiment of the soft decision quantizing pseudo noise generating circuit 3 shown in FIG. 2.

FIG. 5 is a particular embodiment of the soft decision quantizing pseudo noise generator 3 shown in FIG. 2.

Basic operation of the circuit in Pig. 5 will be explained sequentially, and first, a latch register 55 is cleared (not shown in the drawings in particular).

Next, an MSB of a ring counter 56 is set as 1 by a clock input. This value is immediately input to an MSB of the latch register 55, and an address input of a ROM 53 becomes to be '1000', for example. Accordingly, an input of a magnitude comparator 52 becomes to be a threshold level by means of accumulative probability distribution function corresponding to an address '1000' shown in FIG. 4.

Next, in the magnitude comparator 52, a random number which is an output from the PN generating circuit having uniform distribution is compared with the above-described threshold level, and in case that the random number is larger, the MSB of the latch register is set as 1 as it is.

At the next clock input, 1 of the ring counter 56 is shifted to right. Since this is input to the second bit from the MSB of the latch register 55, an output of the register becomes to be '1100'. This is converted again in the ROM 53, and an input of the magnitude comparator 52 becomes to be a threshold level corresponding to '1100' of the accumulative probability distribution function.

And, a value of a uniform random number is compared with this threshold level, and this time, if the random number is smaller, the second bit of the latch register is returned to 0 and is set as '1000'.

At the next clock, 1 of the ring counter is further shifted to right. Thereby, an output of the latch register becomes to be '1010'.

In the same manner below, the processing is conducted until the lowest digit bit, and the whole operation is completed.

A result of the above is extracted by a flip flop (referred to F/F, hereinafter) 54, and is output as a soft decision pseudo noise.

Although a soft decision pseudo noise output generated in the above operation is for the first soft decision quantizing pseudo noise generating circuit 3 having probability density function of a signal component during rake combining in FIG. 1, operation for the second soft decision quantizing pseudo noise generating circuit 6 for generating a Gaussian noise is the same except address allocation for probability distribution function and a signal level.

Returning to FIG. 1, and the explanation will be continued. In the above-described explanation, it can be understood that an output from the first soft decision quantizing pseudo noise generating circuit 3 is made to have probability distribution function same as a signal component generated in rake combining under Rayleigh fading environment. The output is input to the second soft decision quantizing pseudo noise generating circuit 6. The second soft decision quantizing pseudo noise generating circuit 6 has accumulative probability distribution function to which a Gaussian noise is added, and the accumulative probability distribution function is determined in accordance with an equation (2).

$$P_r\left[\frac{Z}{\sqrt{I_0 Z}}\right] = \left[\frac{1}{2}\right]\left[1 - \text{erf}\left[\frac{Z}{\sqrt{I_0 Z}}\right]\right] \quad (2)$$

In the equation (2), Z is energy per bit of a signal component, $I_0$ is single-sided noise power density, and erf is an error function.

Figure 6:
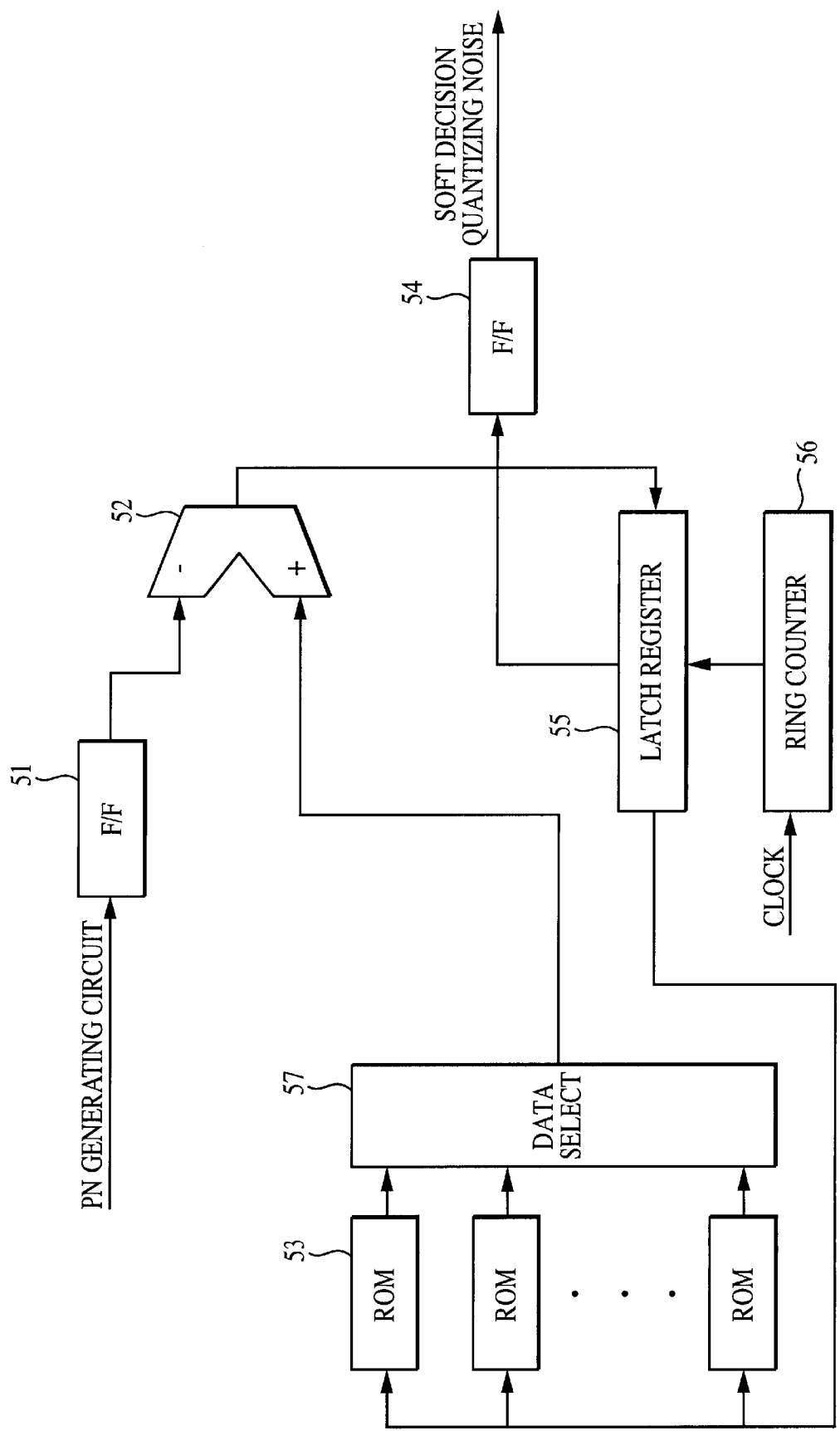
FIG. 6 is a view showing a particular arrangement of the second soft decision quantizing pseudo noise generating circuit 6.

Here, a particular arrangement of the second soft decision quantizing pseudo noise generator 6 will be explained. FIG. 6 is a view showing a particular arrangement of the second soft decision quantizing pseudo noise generator 6.

The second soft decision quantizing pseudo noise generator 6 basically has an arrangement same as the first soft decision quantizing pseudo noise generator 3, except a plurality of ROMs 53 in which probability distribution function is held and a DATA SELECT 57.

There is the number of the ROMs 53 which can be represented by a soft decision quantizing DATA that is an output from the first soft decision quantizing pseudo noise generator 3, and probability distribution function determined in accordance with the signal level is held in each ROM.

The DATA SELECTOR 57 is for selecting a ROM corresponding to a soft decision quantizing DATA that was actually input, based on the DATA. After selecting the ROM, it conducts the sequential processing explained for the above-described first soft decision quantizing pseudo noise generator 3, and defines a soft decision quantizing pseudo noise by means of the F/F 54. In addition, seeing arbitrary one of the ROMs 53, probability distribution function having condition in which a Gaussian noise corresponding to $I_0$ at a signal level corresponding to the ROM is added is maintained.

Accordingly, a length code of the processing conducted every time the soft decision quantizing DATA is updated generates the soft decision quantizing pseudo noise under condition in which a Gaussian noise is added in accordance with signal levels at each time.

In this example, although the ROMs are explained separately, it is possible to substitute one ROM for all of the ROMs by allocating an output of the first soft decision quantizing pseudo noise generator 3 to an upper digit address of the ROM, and of course, it is possible to suitably change the arrangement.

The soft decision quantizing pseudo noise generated in this manner is finally polarized based on a transmission data by means of a polarizing circuit 7, and is sent to an error correcting circuit to be examined.

Next, the second embodiment of the present invention will be explained.

Figure 7:
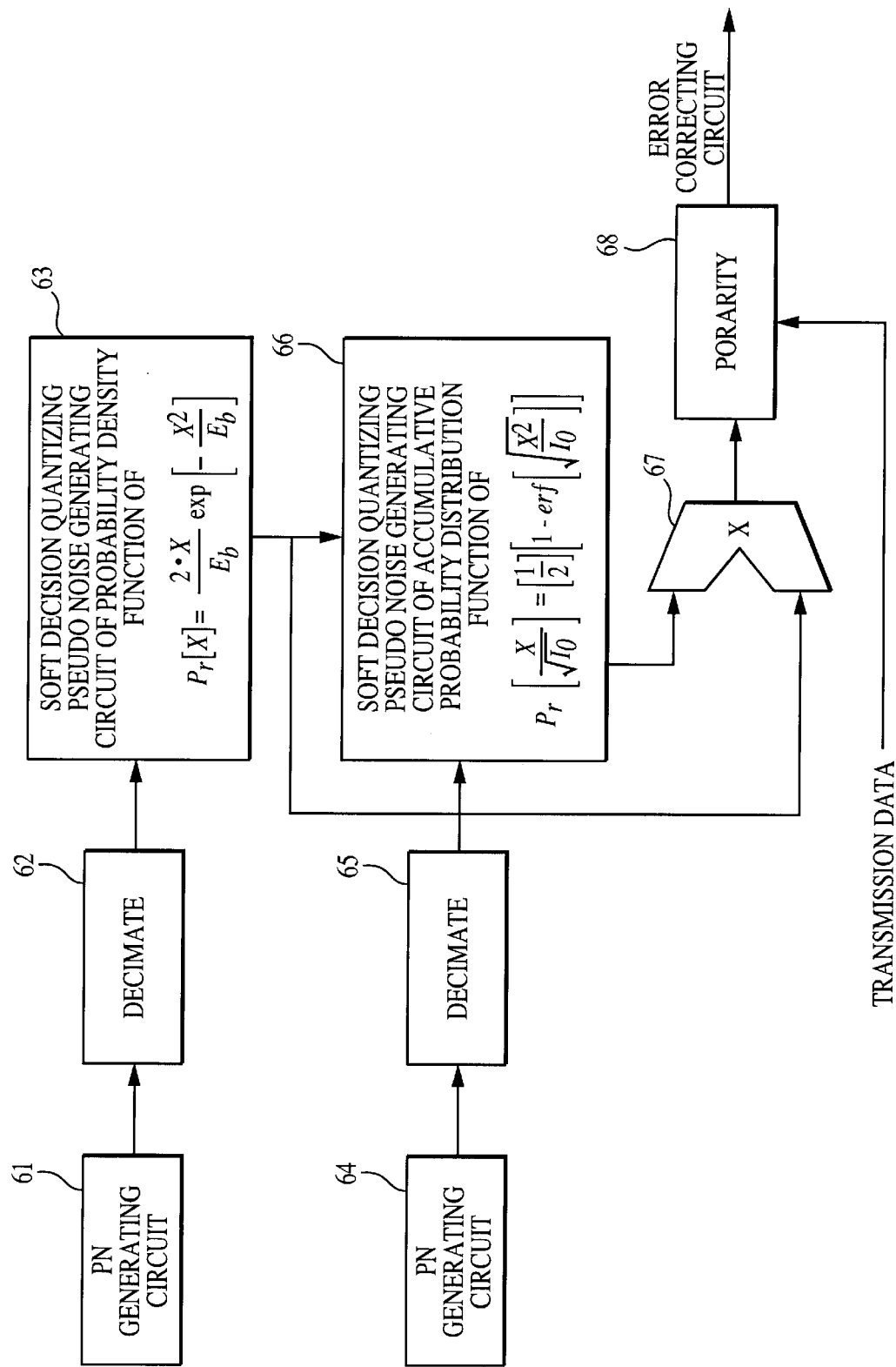
FIG. 7 is a block diagram of the soft decision pseudo noise generating circuit in the second embodiment and FIG. 8 is a block diagram of the soft decision pseudo noise generating circuit in the third embodiment.

FIG. 7 is a block diagram of the soft decision pseudo noise generating circuit in the second embodiment. In the first embodiment, by handling a signal component as Z, that is to say, power, the contents of the ROMs in the first and second soft decision quantizing pseudo noise generating circuits are determined. This is condition in which maximum ratio combining is conducted, if probability distribution function is one in which rake combining in the CDMA system is assumed, and also, in the soft decision Viterbi decoder, the combining is a sum of power, that is to say, maximum ratio combining in a direction along a time axis, and soft decision information that is convenient for branch metric is obtained. Incidentally, in the CDMA system, since a sum of power can be automatically realized by multiplication and summation operations using complex conjugate with a pilot, by making the probability distribution function have a sum of power like in the first embodiment, a multi-dimensional pseudo noise generating circuit for soft-decision decoding, which is suitable for an actual system, is realized.

A different point in the second embodiment from the first embodiment is that a signal component is handled as X, that is to say, magnitude of a signal, and thereby, the contents of the ROMs in the first and second soft decision quantizing pseudo noise generating circuits are determined. The first soft decision quantizing pseudo noise generating circuit 63 is for determining probability distribution function of a signal component during Rayleigh fading, so called Rayleigh distribution, and a ROM in which a numerical data generated by an equation (3) is stored is used.

$$p_r[X] = \frac{2 \cdot X}{E_b} \exp\left[-\frac{X^2}{E_b}\right] \quad (3)$$

Where, X is magnitude of a signal during Rayleigh fading, and Eb is average energy per bit.

Like in the first embodiment, a signal having this probability density function is generated by the first soft decision quantizing pseudo noise generating circuit 63. Same as the second soft decision quantizing pseudo noise generating circuit in the first embodiment, a second soft decision quantizing pseudo noise generating circuit 66 to which the generated signal is input conducts selection of a ROM corresponding to the magnitude of the signal by a data selector, and generates a soft decision quantizing pseudo noise having accumulative probability distribution function of the equation (4) by means of sequential processing.

$$P_r\left[\frac{X}{\sqrt{I_0}}\right] = \left[\frac{1}{2}\right]\left[1 - \text{erf}\left[\sqrt{\frac{X^2}{I_0}}\right]\right] \quad (4)$$

$$\text{erf}(x) = \frac{2}{\sqrt{x}} \int_0^x \exp(-t^2) dt$$

Where, X is magnitude of a signal, $I_0$ is single-sided noise density, and erf is an error function.

Thereby, it is possible to generate a signal with a Rayleigh fading change under Gaussian noise environment.

A different point from the first embodiment is that, while a soft decision quantizing pseudo noise including the generated signal is power weighted by magnitude of the signal in the first embodiment, it is magnitude of the signal before the weighting in the second embodiment.

Accordingly, for example, in order to conduct maximum value synthesis in a direction along a time axis also for branch metric when the soft decision Viterbi decoder is connected, as shown in FIG. 7, it is necessary to conduct multiplication of an output and a signal of the first soft decision quantizing pseudo noise generating circuit 63, which are signal levels, and an output of the second soft decision quantizing pseudo noise generating circuit 66, which is a Gaussian noise.

In addition, with regard to PN generating circuits 61 and 64, decimators 62 and 65, and a polarizing circuit 68, since they have arrangements same as those in the first and second embodiments, explanation thereof will be omitted.

The third embodiment will be explained.

Figure 8:
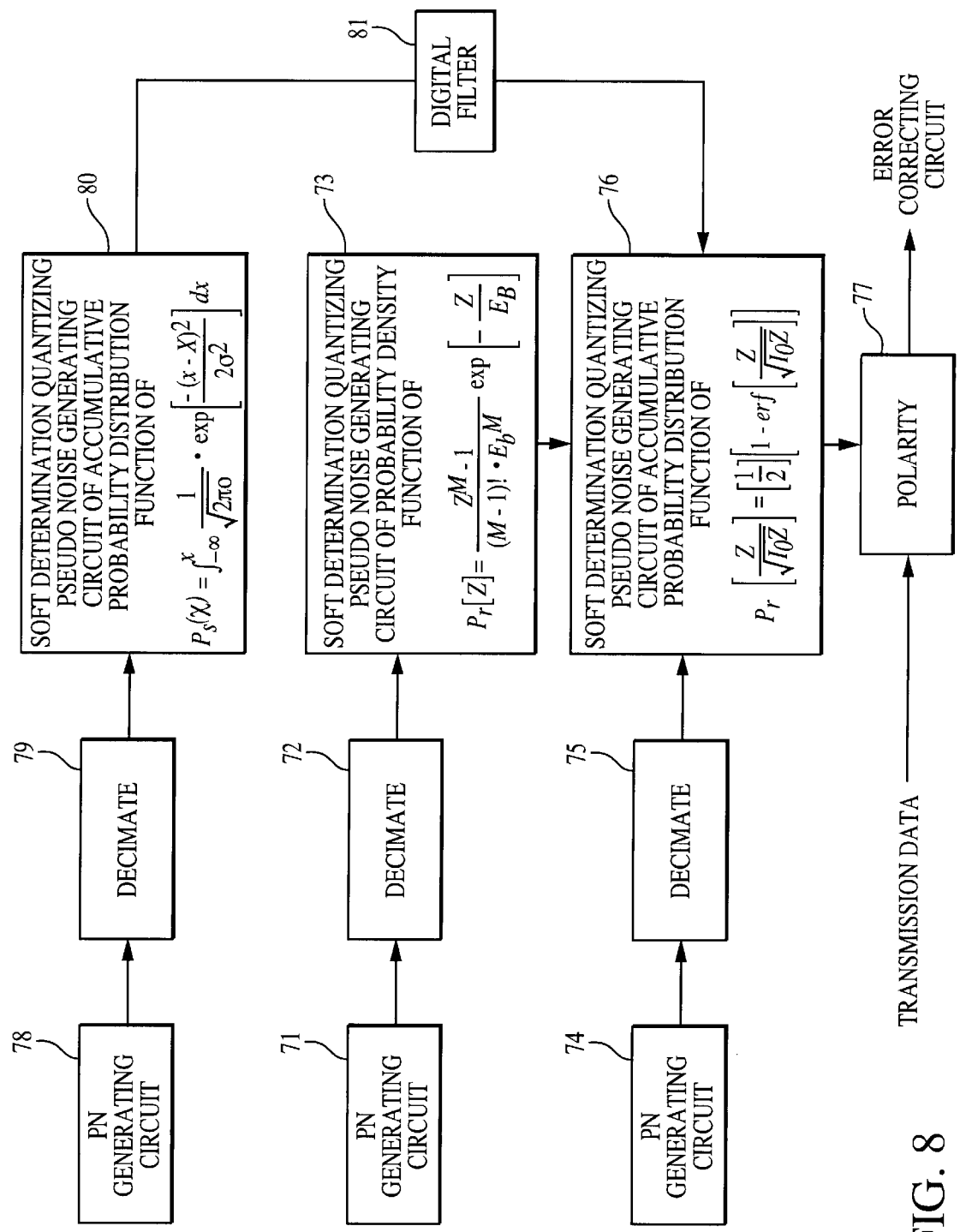

FIG. 8 is a block diagram of a soft decision pseudo noise generating circuit in the third embodiment.

A soft decision pseudo noise generating circuit in the third embodiment is one under Rayleigh fading environment and one in a case that there is a change of a median of Rayleigh fading due to shadowing. Although change speed of the median change is defined by speed of movement, if represented by a distance of movement, it is an order of several 10 meters to several 100 meters. Accordingly, in order to obtain a gentle change, a digital filter 81 is connected to an output of a first pseudo noise generating circuit 80 corresponding to a source for generating the shadowing, out of a plurality of first pseudo noise generating circuits 73 and 80, and after processing for realizing the gentle change as much as possible, the digital filter is connected to a second pseudo noise generating circuit 72. The median change of the Rayleigh fading due to shadowing can be approximately represented well by dB normal distribution, and accumulative probability distribution function Ps(χ) of a dB normal change is shown by an equation (5).

$$P_s(x) = \int_{-\infty}^x \frac{1}{\sqrt{2\pi\sigma}} \cdot \exp\left[\frac{-(x-X)^2}{2\sigma^2}\right] dx \quad (5)$$

Where, χ is a median change dB of Rayleigh fading, and X is a decibel value dB of a long interval median.

Since, filtering processing of linear operation is applied to normal distribution, the normal distribution is not changed, signals which become to be a part of address determining means of the second pseudo noise generating circuit 76 form normal distribution. Since these signals which form the normal distribution are decibel values, a relation between an address and memory contents of a memory build in the second pseudo noise generating circuit 76 is determined by taking a relation of log into account. Since another first pseudo noise generating circuit 73 is the same as in the first and second embodiments, the explanation thereof will be omitted. Also, with regard to other circuits also, since they are the same as in the first and second embodiments, the explanation thereof will be omitted.

As explained above, if the multi-dimensional pseudo noise generating circuit for soft-decision decoding of the present invention is used, since in testing an error correcting circuit having a high coding gain, as represented by a soft decision Viterbi decoder for mobile communication, characteristic evaluation can be conducted on a baseband by means of the multi-dimensional pseudo noise generating circuit for soft-decision decoding without inserting a Rayleigh fading simulator on a radio circuit, there are effects below.

(1) Even though some errors exist in a circuit, by means of strong error correcting ability of the Viterbi decoder, it becomes to be possible to detect a problem at an early stage, which was not found, and it is possible to reduce retrograde workload due to the problem which was conventionally found in a final process, and to provide efficient development environment as a whole. This kind of error can be found by looking at BER characteristic and so forth in an error rate test by means of the multi-dimensional pseudo noise generating circuit for soft decision.

(2) It is possible to test a soft decision error correcting function on the baseband by means of entire digital signals. Thereby, it becomes to be unnecessary to superimpose $Eb/N_0$ by means of a subtle attenuator on an RF, which was conventionally conducted through an RF circuit. Furthermore, although reproduction was bad due to interference by other apparatuses in an experimental room, in a test for a long time in such a subtle region, it is possible to conduct rake combining by means of arbitrary probability distribution function such as Rayleigh fading, and a test under other condition with good reproducibility.

(3) It is possible to conduct error rate characteristic of a soft decision error correcting circuit by means of a simple and cheap method without need of a measurement apparatus such as a Rayleigh fading simulator.

The entire disclosure of Japanese Application No. 10-287488 filed Oct. 9, 1998 including specification, claims, drawing and summary are incorporated herein by reference in its entirely.

What is claimed is:

1. A multi-dimensional pseudo noise generating circuit for soft-decision decoding, comprising:

PN generating means for generating a signal of binary length code;

a memory for storing a threshold level based on predetermined probability density function;

address generating means for generating an address of said memory; and comparison means for comparing a data read from said memory with the binary length code generated by the PN generating means in a preset bit length, wherein the address of said address generating means is successively updated based on a result from said comparison means, and an address at the end of comparison is output as pseudo noise information.

2. A multi-dimensional pseudo noise generating circuit for soft-decision decoding according to claim 1, wherein said address generating means is constructed so that an address value in which an MSB is one and other bits are zero is set as an initial value, and in case that said binary length code is larger than a comparison result of said comparison means, one is hold as a value of said MSB, and in case that said binary length code is smaller than a comparison result of said comparison means, a value of said MSB is set as zero, and subsequently, a value of the next digit bit of said MSB is set as one, and in case that said binary length code is larger than a comparison result of said comparison means, one is hold as a value of said next digit bit, and in case that said binary length code is smaller than a comparison result of said comparison means, processing for making a value of said next digit bit zero is continued until an LSB, and a final address value is output as pseudo noise information.

3. A multi-dimensional pseudo noise generating circuit for soft-decision decoding comprises:

a first pseudo noise generating circuit having; first PN generating means for generating a signal of binary length code, a first memory for storing a threshold level based on accumulative probability distribution function obtained by integrating predetermined probability density function, first address generating means for generating an address of said first memory, and first comparison means for comparing a data read from said first memory with the binary length code generated by the PN generating means in a preset bit length, wherein the address of said first address generating means is successively updated based on a result from said first comparison means, and an address at the end of comparison is output and a second pseudo noise generating circuit having; second PN generating means for generating a signal of binary length code, a second memory for storing a threshold level based on accumulative probability distribution function obtained by integrating predetermined probability density function, second address generating means for generating an address of said second memory, and second comparison means for comparing a data read from said second memory with the binary length code generated by the second PN generating means in a preset bit length, wherein the address of said second address generating means is successively updated based on a result from said second comparison means and an output from said first pseudo noise generating circuit, and an address at the end of comparison is output as pseudo noise information.

4. A multi-dimensional pseudo noise generating circuit for soft-decision decoding according to claim 3, wherein said first and second address generating means are constructed so that an address value in which an MSB is one and other bits are zero is set as an initial value, and in case that said binary length code is larger than a comparison result of said comparison means, one is hold as a value of said MSB, and in case that said binary length code is smaller than a comparison result of said comparison means, a value of said MSB is set as zero, and subsequently, a value of the next digit bit of said MSB is set as one, and in case that said binary length code is larger than a comparison result of said comparison means, one is hold as a value of said next digit bit, and in case that said binary length code is smaller than a comparison result of said comparison means, processing for making a value of said next digit bit zero is continued until a lower bit, and a final address value is output as pseudo noise information.

5. A multi-dimensional pseudo noise generating circuit for soft-decision decoding according to claim 3, wherein said second pseudo noise generating circuit has a plurality of memories of which threshold levels stored therein are different from each other, and a selector for selecting a predetermined memory out of said plurality of memories based on an output from said first pseudo noise generating circuit, and said second comparison means is constructed so as to compare a threshold level output from said selector with the binary length code generated by said second PN generating means in a preset bit length.

6. A multi-dimensional pseudo noise generating circuit for soft-decision decoding according to claim 3, further comprising a plurality of said first pseudo noise generating circuits, and an address of the second address generating means of said second pseudo noise generating circuit is successively updated based on a result from said second comparison means and outputs from said plurality of first pseudo noise generating circuits, and an address at the end of comparison is output as pseudo noise information.

7. A multi-dimensional pseudo noise generating circuit for soft-decision decoding comprises:

a first pseudo noise generating circuit having first PN generating means for generating a signal of binary length code, a first memory for storing a threshold level based on accumulative probability distribution function obtained by integrating predetermined probability density function, first address generating means for generating an address of said first memory, and first comparison means for comparing a data read from said first memory with the binary length code generated by the PN generating means in a preset bit length, wherein the address of said first address generating means is successively updated based on a result from said first comparison means, and an address at the end of comparison is output;

a second pseudo noise generating circuit having second PN generating means for generating a signal of binary length code, a second memory for storing a threshold level based on accumulative probability distribution function obtained by integrating predetermined probability density function, second address generating means for generating an address of said second memory, and second comparison means for comparing a data read from said second memory with the binary length code generated by the second PN generating means in a preset bit length, wherein the address of said second address generating means is successively updated based on a result from said second comparison means and an output from said first pseudo noise generating circuit, and an address at the end of comparison is output; and multiplication means for multiplying an output from said first pseudo noise generating circuit by an output from said second pseudo noise generating circuit, and outputting a result of this multiplication as pseudo noise information.

8. A multi-dimensional pseudo noise generating circuit for soft-decision decoding according to claim 7, characterized in that said first and second address generating means are constructed so that an address value in which an MSB is one and other bits are zero is set as an initial value, and in case that said binary length code is larger than a comparison result of said comparison means, one is hold as a value of said MSB, and in case that said binary length code is smaller than a comparison result of said comparison means, a value of said MSB is set as zero, and subsequently, a value of the next digit bit of said MSB is set as one, and in case that said binary length code is larger than a comparison result of said comparison means, one is hold as a value of said next digit bit, and in cage that said binary length code is smaller than a comparison result of said comparison means, processing for making a value of said next digit bit zero is continued until an LSB, and a final address value is output as pseudo noise information.

9. A multi-dimensional pseudo noise generating circuit for soft-decision decoding according to claim 7, wherein said second pseudo noise generating circuit has a plurality of memories of which threshold levels stored therein are different from each other, and a selector for selecting a predetermined memory out of said plurality of memories based on an output from said first pseudo noise generating circuit, and said second comparison means is constructed so as to compare a threshold level output from said selector with the binary length code generated by said second PN generating means in a preset bit length.

\* \* \* \* \*